(12) United States Patent
Ma

(10) Patent No.: US 6,210,203 B1
(45) Date of Patent: Apr. 3, 2001

(54) RETENTION MECHANISM FOR ELECTRONIC DEVICE

(75) Inventor: Hao-Yun Ma, Taipei (TW)

(73) Assignee: Hon Hai Precision Ind., Co., Ltd., Taipei (TW)

( * ) Notice: Subject to any disclaimer, the term of this patent is extended or adjusted under 35 U.S.C. 154(b) by 0 days.

(21) Appl. No.: 09/347,951

(22) Filed: Jul. 6, 1999

(30) Foreign Application Priority Data

Dec. 24, 1998 (TW) .................................. 87221546

(51) Int. Cl.[7] .............................. H01R 13/64; H01R 4/48
(52) U.S. Cl. ........................ 439/377; 439/374; 439/759
(58) Field of Search ................................. 439/377, 374, 439/759; 312/334.7

(56) References Cited

U.S. PATENT DOCUMENTS 5,806,949 * 9/1998 Johnson ........................ 312/334.7
6,017,233 * 1/2000 Fry et al. ........................ 439/248

* cited by examiner

Primary Examiner—Lincoln Donovan
Assistant Examiner—Chandrika Prasad
(74) Attorney, Agent, or Firm—Wei Te Chung

(57) ABSTRACT

A retention mechanism for retaining a CPU module includes a base having two ends to which two retention arms are mounted thereby forming a U-shaped configuration for accommodating the CPU module therein. Each retention arm has a bottom wall and two side walls thereby defining a channel therebetween for receiving an edge of the CPU module. The bottom wall has a cantilevered beam extending therefrom which is deflected when the CPU module is inserted into the retention mechanism. An opening is defined in the bottom wall for partially receiving the deflected beam and the beam is dimensioned to refrain from protruding beyond the bottom wall when the CPU module is inserted into the retention mechanism.

5 Claims, 6 Drawing Sheets

RETENTION MECHANISM FOR ELECTRONIC DEVICE

BACKGROUND OF THE INVENTION

1. Field of the Invention

The present invention generally relates to a retention mechanism for retaining a central processing unit (CPU) module.

2. The Prior Art

A retention mechanism having a base and two retention arms extending therefrom to form a U-shaped configuration for retaining a CPU module therein is well known in the electronics field. Examples are disclosed in Taiwan Patent Application Nos. 85216150, 86207711, 86207803 and 86209531.

FIG. 5 of the attached drawings shows a conventional retention mechanism comprising a base 7 for being supported on a main computer board (not shown) and two retention arms 6 extending from opposite ends thereof. Each retention arm 6 defines a channel 61 for receiving an edge of a CPU module 5 as shown in FIG. 6. An opening 63 is defined in a bottom wall of the retention arm 6 for accommodating a resilient finger 62. The finger 62 has an arcuate body 622 having a first end 621 fixed to the bottom wall of the retention arm 6 and a free end 623 movable through the opening 63. The finger 62 is deformed upon insertion of the CPU module 5 for resiliently engaging with and thus retaining the CPU module 5 in the retention mechanism.

The deformation of the resilient finger 62 upon insertion of the CPU module 5 causes the free end 623 thereof to protrude outward beyond the bottom wall of the retention arm 6. Thus, the finger 62 may inadvertently interfere with other components mounted on a main computer board, such as a heat sink of the CPU module, thereby causing undesired damage.

It is thus desired to have a retention mechanism that does not have the problem discussed above.

SUMMARY OF THE INVENTION

Accordingly, an object of the present invention is to provide a retention mechanism for retaining an electronic device on a circuit board which does not mechanically interfere with other components mounted on the circuit board.

Another object of the present invention is to provide a retention mechanism for retaining an electronic device without damaging the electronic device.

To achieve the above objects, a retention mechanism in accordance with the present invention comprises a base having two ends to which two retention arms are mounted thereby forming a U-shaped configuration for accommodating the CPU module therein. Each retention arm has a bottom wall and two side walls thereby defining a channel therebetween for receiving an edge of the CPU module. The bottom wall has a cantilevered beam extending therefrom which is deflected when the CPU module is inserted into the retention mechanism. An opening is defined in the bottom wall for partially receiving the deflected beam and the beam is dimensioned to refrain from protruding beyond the bottom wall when the CPU module is inserted into the retention mechanism.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
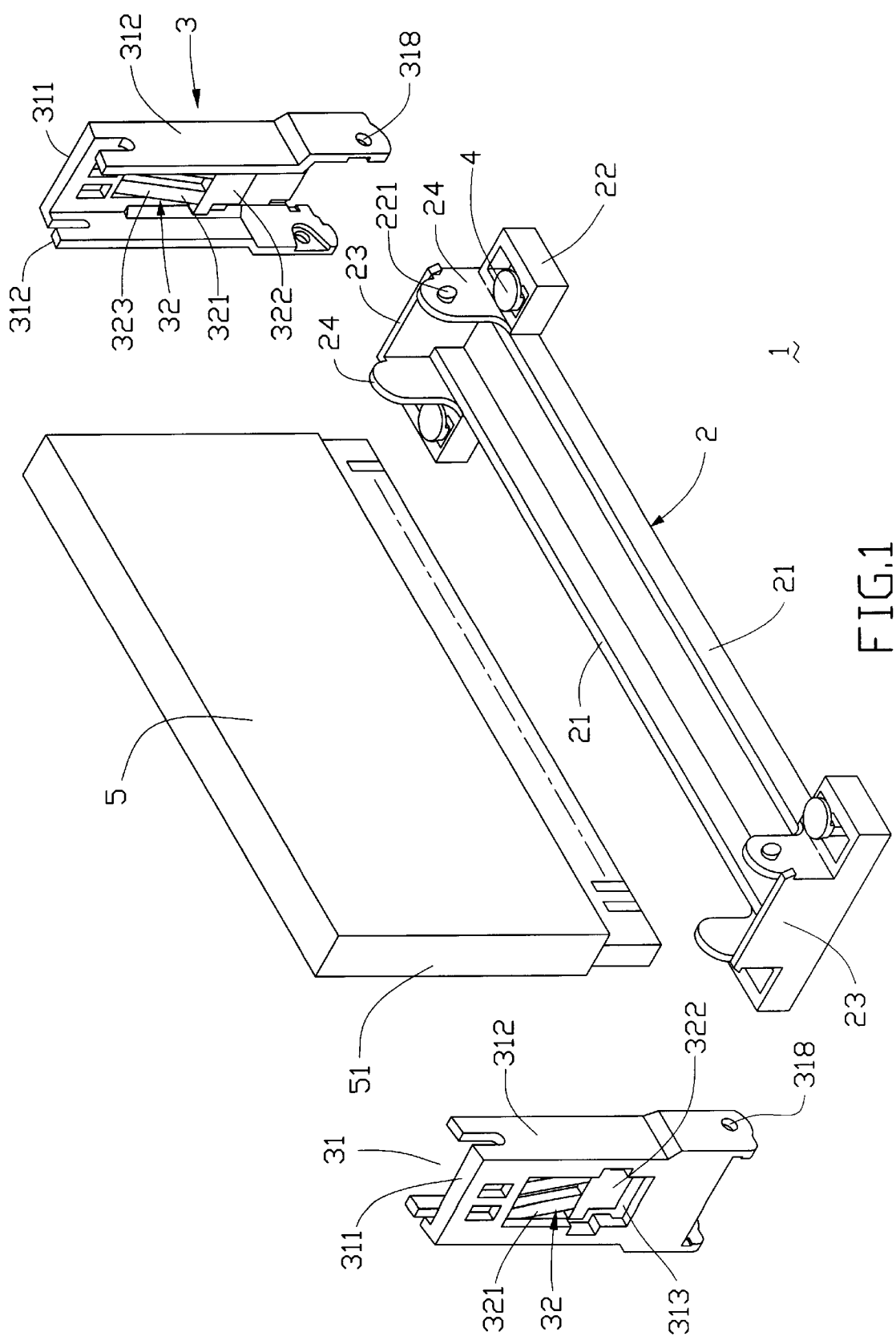
FIG. 1 is an exploded view of a retention mechanism constructed in accordance with the present invention and a central processing unit module to be mounted thereto.
Figure 2:
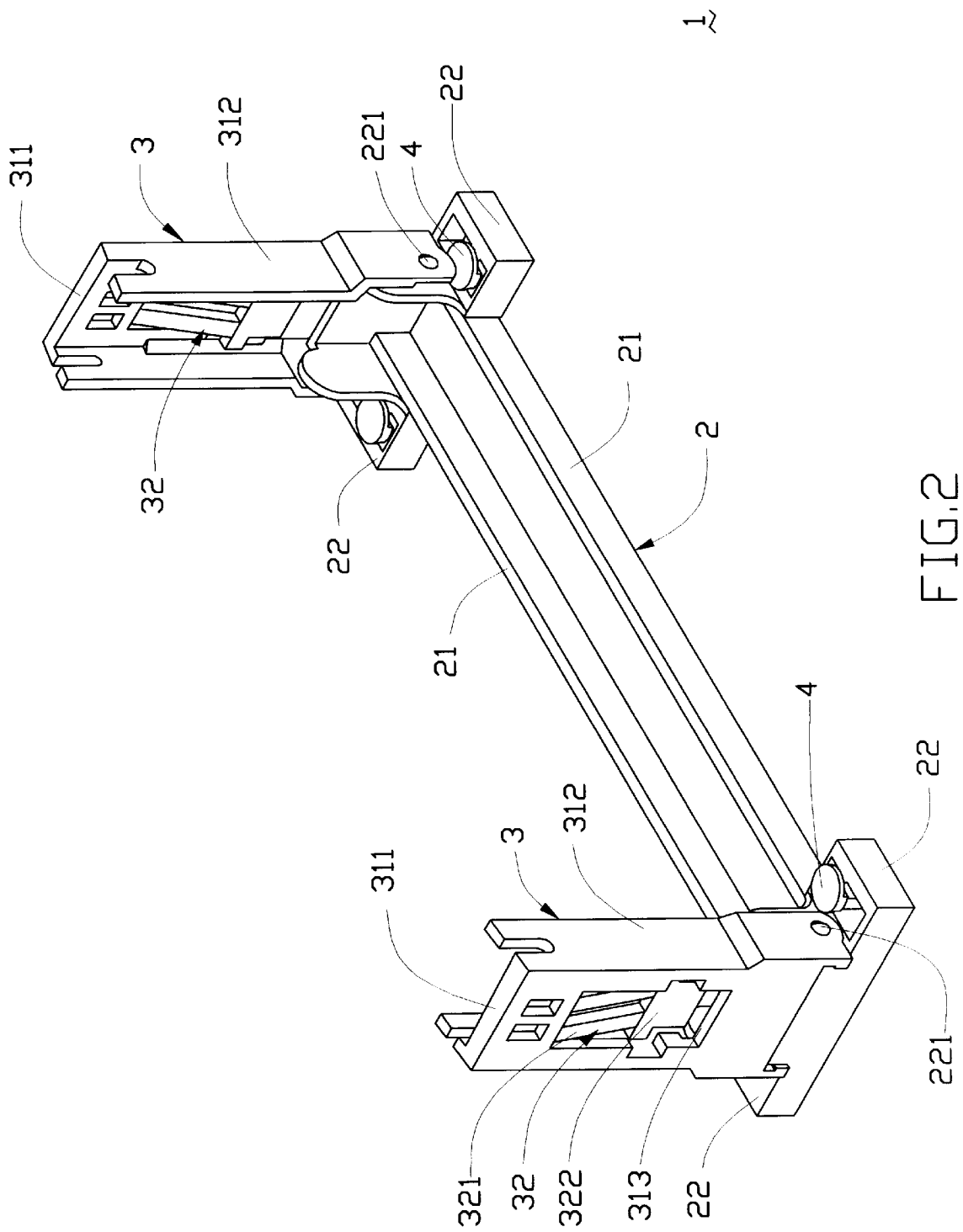
FIG. 2 is a perspective view of the retention mechanism of the present invention.

Referring to the drawings and in particular to FIGS. 1 and 2, a retention mechanism 1 constructed in accordance with the present invention comprises an elongate base 2 having two spaced side plates 21 connected at two ends thereof by end walls 23. Each side plate 21 forms a pair of extensions 24 at opposite ends thereof with a trunnion 221 extending transversely from each extension 24. Each side plate 21 also forms two sideways projections 22 on opposite ends thereof for being supported on a circuit board (not shown), such as a main computer board, and fixed thereto by means of fasteners 4.

A retention arm 3 forms a bottom wall 311 and two side walls 312 thereby defining a channel 31 therebetween for receiving an edge 51 of a central processing unit (CPU) module 5. The side walls 312 define pivot holes 318 therein for receiving the corresponding trunnions 221 of the base 2 thereby pivotally attaching each retention arm 3 to the base 2. The retention arms 3 are pivotal between an expanded position as shown in FIG. 2 for receiving the CPU module 5 therein and a folded position (not shown) wherein the retention arms 3 overlap the base 2 for space conservation purposes.

Figure 3:
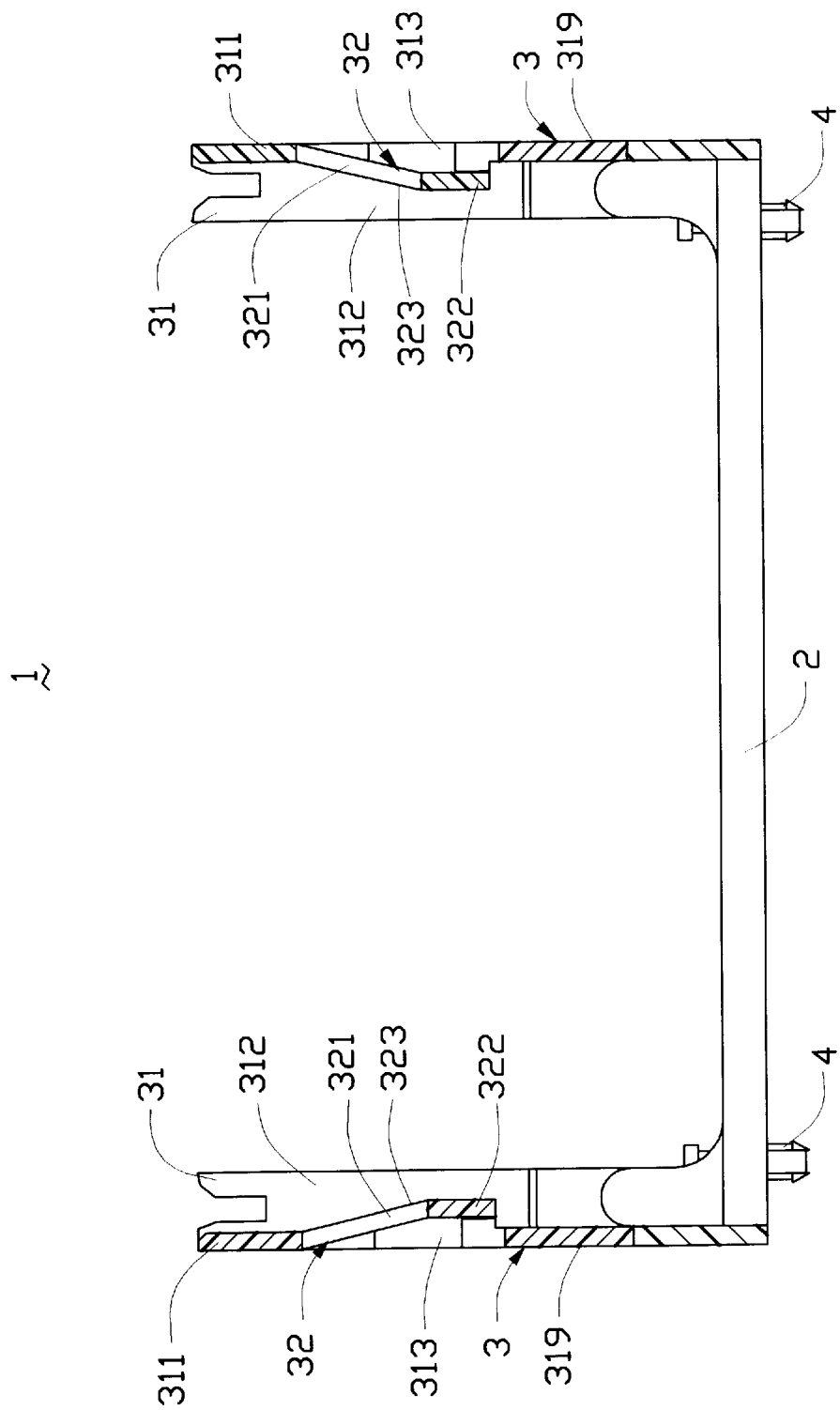
FIG. 3 is a sectional view of the retention mechanism of the present invention.
Figure 4:
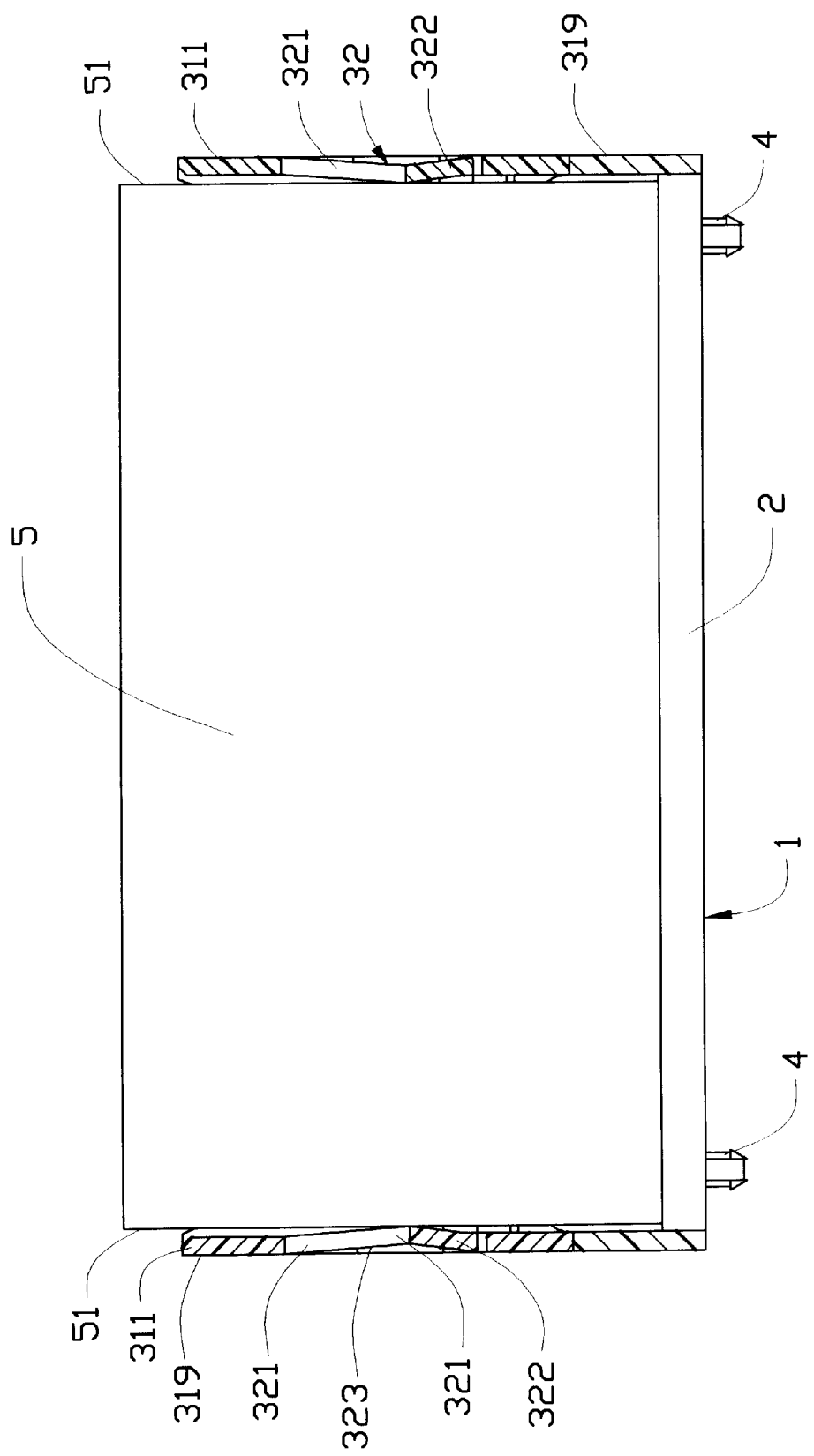
FIG. 4 is a sectional view of the retention mechanism of the present invention with the central processing unit module mounted therein.
Figure 5:
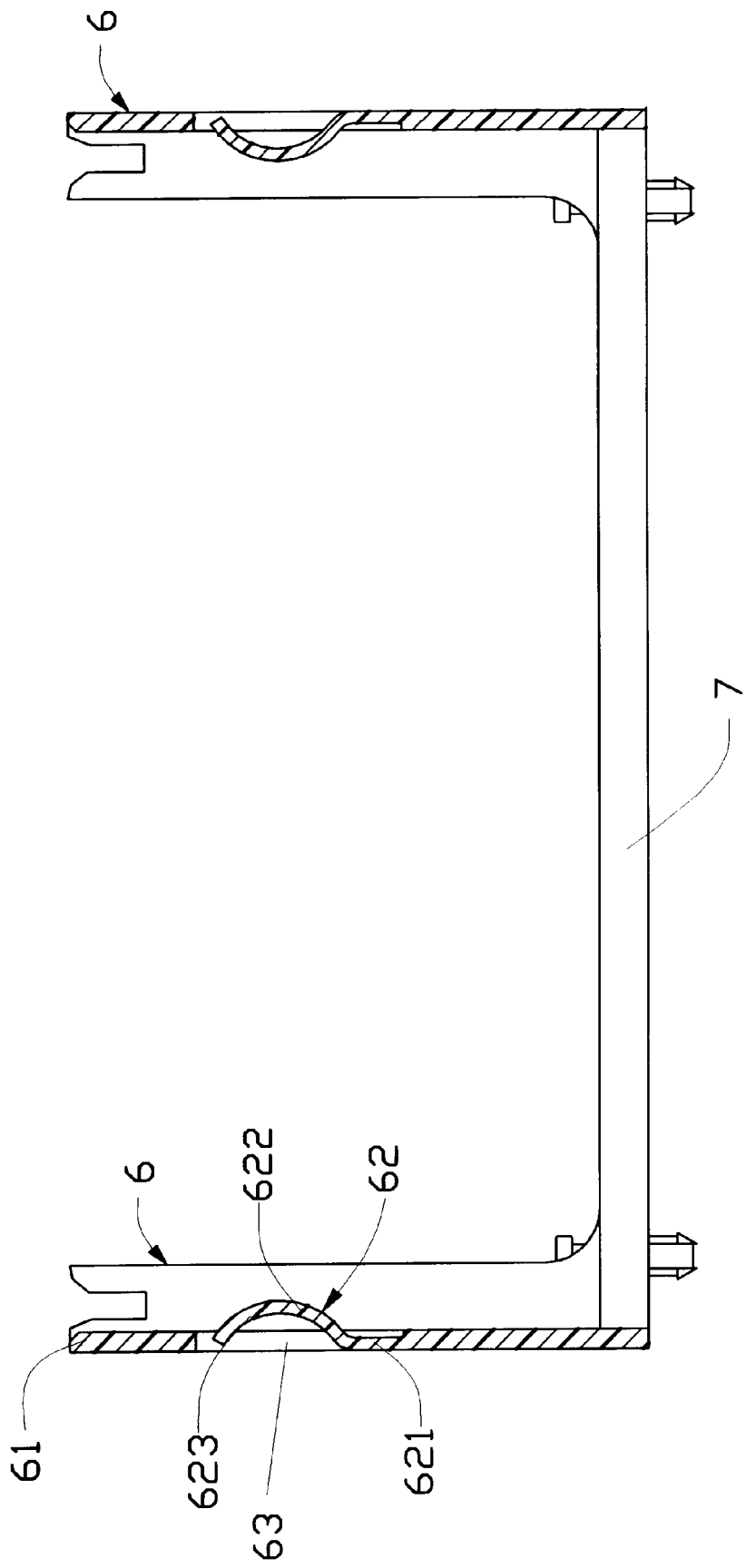
FIG. 5 is a cross-sectional view of a conventional retention mechanism.
Figure 6:
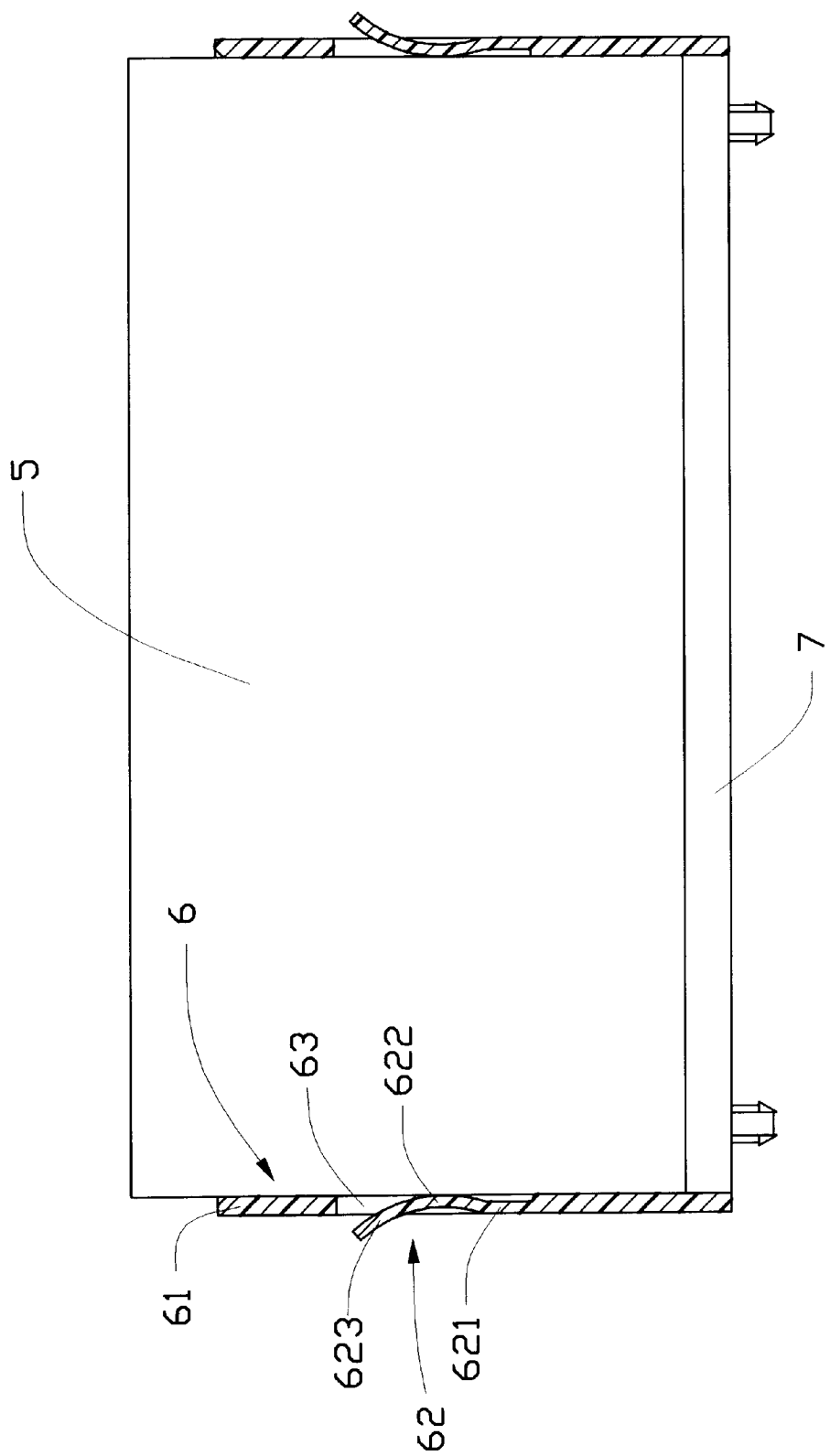
FIG. 6 is a cross-sectional view of the conventional retention mechanism with a central processing unit module mounted therein.

The bottom wall 311 of each retention arm 3 comprises a CPU retaining means 32 for tightly engaging with the edge 51 of the CPU module 5 thereby retaining the CPU module 5 in the retention mechanism 1. As shown in FIG. 3, the retaining means 32 comprises a straight cantilevered beam 321 extending at an incline from the bottom wall 311 of the retention arm 32 and an end section 322 formed at a free end of the beam 321. Preferably, the beam 321 comprises two spaced sections connecting the end section 322 to the bottom wall 311 and defining a central opening therebetween for reducing the rigidity of the beam 321.

The beam 321 forms a guiding face 323 for guiding the CPU module 5 into the retention mechanism 1. The beam 321 deflects when the CPU module 5 is inserted into the retention mechanism 1 and applies a force on the edge 51 of the CPU module 5 for retaining the CPU module 5 in the retention mechanism 1. The bottom wall 311 of each retention arm 3 defines an opening 313 for accommodating the end section 322 and the beam 321 when the beam 321 is deflected.

The beam 321 and the end section 322 are dimensioned so that the end section 322 does not protrude beyond an outside surface 319 of the bottom wall 311 of the retention arm 3 when the CPU module 5 is inserted into the retention mechanism 1. Thus, mechanical interference caused by the protrusion of the end section 322 and the beam 321 of each retention arm 3 is effectively prevented.

The two section configuration of the beam 321 reduces the rigidity thereof. Thus, the force applied to the edge 51 of the CPU module 5 is reduced thereby preventing damage from being incurred on the CPU module 5.

Although the present invention has been described with reference to the preferred embodiment, it is apparent to those skilled in the art that a variety of modifications and changes may be made without departing from the scope of the present invention which is intended to be defined by the appended claims.

What is claimed is:

1. A retention mechanism comprising a base having two ends to which two retention arms are mounted thereby forming a U-shaped configuration adapted to accommodate an external electronic device therein, each retention arm comprising a bottom wall and two side walls thereby defining a channel therebetween adapted to receive an edge of the external electronic device, the bottom wall comprising a cantilevered beam extending therefrom, the cantilevered beam being deflected when the external electronic device is inserted into the retention mechanism, an opening being defined in the bottom wall for partially receiving the deflected beam, the beam being dimensioned to refrain from protruding beyond the bottom wall when the external electronic device is inserted into the retention mechanism.

2. The retention mechanism as claimed in claim 1, wherein the beam comprises a straight portion extending at an incline from the bottom wall and having a free end on which an end section is mounted.

3. The retention mechanism as claimed in claim 2, wherein the straight portion comprises two spaced sections connecting the end section to the bottom wall of the retention arm.

4. The retention mechanism as claimed in claim 2, wherein the straight portion forms a guiding face for guiding the external electronic device into the retention mechanism.

5. A retention mechanism comprising a base having two ends to which two opposite retention arms are mounted thereby forming a U-shaped configuration adapted to accommodate an external electronic device therein, each retention arm comprising a bottom wall and two side walls thereby defining a channel therebetween adapted to receive an edge of the external electronic device, the bottom wall defining retaining means including a cantilevered beam downwardly extending at an incline from the bottom wall and an end section formed at a free end of the cantilevered beam wherein said end section extends perpendicular to the base, and the two cantilevered beams of the two opposite retention arms are deflectable, by inserting an external device between the two retention arms, outwardly away from each other while the end section does not protrude beyond an outer surface of the bottom wall of the corresponding retention arm.

* * * * *